United States Patent
Tran (10) Patent No.: US 6,574,129 B1
(45) Date of Patent: Jun. 3, 2003

(54) RESISTIVE CROSS POINT MEMORY CELL ARRAYS HAVING A CROSS-COUPLE LATCH SENSE AMPLIFIER

(75) Inventor: Lung T. Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/136,976

(22) Filed: Apr. 30, 2002

(51) Int. Cl.[7] .............................................. G11C 17/00
(52) U.S. Cl. ................. 365/94; 65/97; 65/100
(58) Field of Search ................. 365/94, 97, 100, 365/158, 171, 173

(56) References Cited

U.S. PATENT DOCUMENTS

| | | | |
|---|---|---|---|
| 5,793,697 A | 8/1998 | Scheuerlein | 365/171 |
| 6,169,686 B1 | 1/2001 | Brug et al. | 365/171 |
| 6,185,143 B1 * | 2/2001 | Perner et al. | 365/171 |
| 6,256,247 B1 | 7/2001 | Perner | 365/171 |
| 6,259,644 B1 | 7/2001 | Tran et al. | 365/171 |
| 6,292,389 B1 | 9/2001 | Chen et al. | 365/171 |
| 6,297,983 B1 | 10/2001 | Bhattacharyya | 365/158 |
| 6,385,111 B2 * | 5/2002 | Tran et al. | 365/171 |

* cited by examiner

Primary Examiner—Trong Phan (57) ABSTRACT

A data storage device is disclosed that includes a resistive cross point array of memory cells, a plurality of word lines, and a plurality of bit lines, and a sense amplifier that utilizes a cross-coupled latch sense circuit. The memory cells can be single cross points in one embodiment. In another embodiment, the memory cells are arranged into multiple groups of two or more memory cells. The memory cells of each group are connected between a respective word line and a common isolation diode that is coupled to a bit line.

24 Claims, 6 Drawing Sheets

RESISTIVE CROSS POINT MEMORY CELL ARRAYS HAVING A CROSS-COUPLE LATCH SENSE AMPLIFIER

BACKGROUND OF THE INVENTION

The present invention relates generally to resistive cross point memory cell arrays and, more particularly, the present invention relates to a resistive cross point memory cell array having a cross-couple latch amplifier.

Many different resistive cross point memory cell arrays have been proposed, including resistive cross point memory cell arrays having magnetic tunnel junction (MTJ) elements, phase change memory elements, and write-once (e.g., fuse based or anti-fuse based) resistive memory elements.

A typical MRAM storage device, for example, includes an array of memory cells. Word lines may extend along rows of the memory cells, and bit lines may extend along columns of the memory cells. Each memory cell is located at a cross point of a word line and a bit line. Each MRAM memory cells stores a bit of information as an orientation of a magnetization. In particular, the magnetization of each memory cell assumes one of two stable orientations at any given time. These two stable orientations, parallel and anti-parallel, represent logic values of 0 and 1. The magnetization orientation affects the resistance of a memory cell. For example, the resistance of a memory cell may be a first value, R, if the magnetization orientation is parallel, and the resistance of the memory cell may be increased to a second value, R+ΔR, if the magnetization orientation is changed from parallel to anti-parallel.

In general, the logic state of a resistive cross point memory cell may be read by sensing the resistance state of the selected memory cell. Sensing the resistance state of a single memory cell in the array, however, typically is difficult because all of the memory cells in a resistive cross point memory cell array are interconnected by many parallel paths. Thus, the resistance that is seen at one cross point equals the resistance of the memory cell at that cross point in parallel with resistances of memory cells in the other word lines and bit lines. In addition, if the target memory cell being sensed has a different resistance state due to stored magnetization, a small differential voltage may develop. This small differential voltage may give rise to parasitic or "sneak path" currents that may interfere with the sensing of the resistance state of the target memory cell.

Thus, one hurdle that must be overcome before high density and fast access resistive cross point memories may be developed is the reliable isolation of selected resistive cross point memory cells while data stored on a selected memory cell is being sensed. In general, prior techniques for isolating such memory cells fall into one of three memory cell isolation categories: select transistor isolation techniques; diode isolation techniques; and equipotential isolation techniques.

Known transistor isolation techniques typically involve inserting a select transistor in series with each resistive cross point memory cell. This architecture typically is characterized by fast read access times. Unfortunately, such as series transistor architecture typically also is characterized by relatively poor silicon area utilization because the area under the resistive cross point memory cell array typically is reserved for the series transistors and, therefore, is unavailable for support circuits. In addition, this isolation technique also tends to suffer from relatively poor memory cell layout density because area must be allocated in each memory cell with via that connects the memory cell to the series transistor in the substrate. This isolation technique also generally requires relatively high write currents because an isolated write conductor must be added to the memory cell to provide a write circuit in parallel with a read circuit and the location of the write conductor results in high write currents to generate the required write fields. In general, this approach is limited to a single memory plane because the series transistors must be located in the substrate and there is no practical way to move the series transistors out of the substrate and into the memory cell plane.

Diode isolation techniques typically involve inserting a diode in series with each resistive cross point memory element. This memory cell array architecture may be implemented with thin film diodes that allow multi-level resistive cross point memory arrays to be constructed (see, e.g., U.S. Pat. No. 5,793,697). This architecture has potential for high-speed operation. The difficulty often associated with this architecture involves providing a suitable thin film diode with minimum process feature sizes matching the potential density of the memory cell arrays. In addition, this approach uses one diode per memory element and, at currently practical MRAM features and parameters, for example, each diode would be required to conduct 5 to 15 kA/cm$^2$. Such high current densities generally are impractical for implementing thin film diodes in high-density MRAM arrays.

Equipotential isolation techniques typically involve sensing resistive cross point memory cells without using series diodes or transistors (see, e.g., U.S. Pat. No. 6,259,644). This approach may be implemented by a cross point array of memory elements that is relatively simple to fabricate. This cross point memory cell array architecture typically has a density that is limited only by the minimum feature sizes of the implementing circuit technology and typically requires relatively low write currents. In addition, it is relatively simple to extend this approach to multi-level resistive cross point memory cell arrays to achieve very high-density memories. Equipotential isolation, however, often is difficult to implement in large arrays. Auto-calibration and triple sample read techniques have been used to sense data in large MRAM arrays using equipotential isolation techniques, but these sense processes typically limit the read sense time to a few micro-seconds.

SUMMARY OF THE INVENTION

In one aspect, the invention features a data storage device that includes a resistive cross point array of memory cells, a plurality of word lines, and a plurality of bit lines, and a sense amplifier that utilizes a cross-coupled latch sense circuit. The memory cells can be single cross points in one embodiment. In another embodiment, the memory cells are arranged into multiple groups of two or more memory cells. The memory cells of each group are connected between a respective word line and a common isolation diode that is coupled to a bit line.

Other features and advantages of the invention will become apparent from the following description, including the drawings and the claims.

DETAILED DESCRIPTION OF SPECIFIC EMBODIMENTS

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
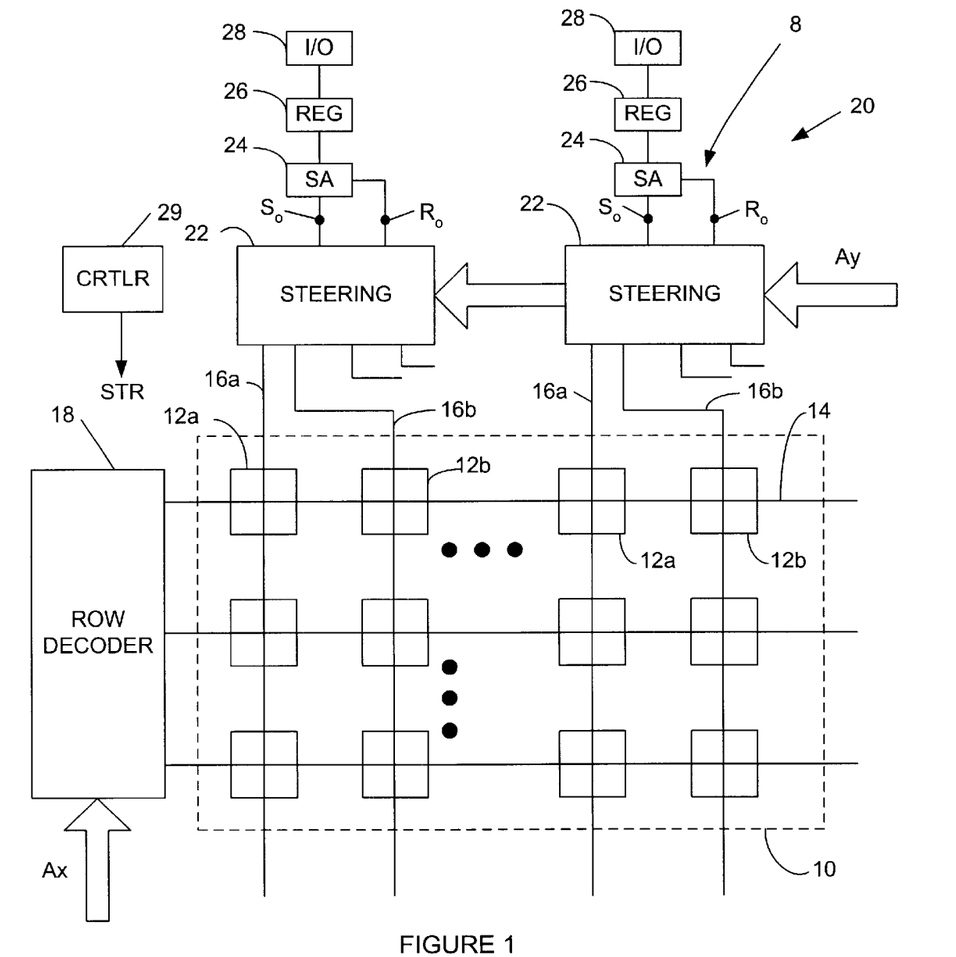
FIG. 1 is a circuit diagram of a data storage device that includes a resistive cross point array of memory cells, multiple read circuits and associated steering circuits, and a word line decode circuit.

Referring to FIG. 1, in one embodiment, a data storage device 8 includes a resistive cross point memory cell array 10, a plurality of word lines 14 that extend along rows of the cross point memory cell array 10, and plurality of bit lines 16a, 16b that extend along columns of the cross point memory cell array 10. The memory cells 12a, 12b of memory cell array 10 may be implemented as any one of a wide variety of conventional resistive memory elements, including magnetic random access memory (MRAM) elements, phase change memory elements, and write-once (e.g., fuse based or anti-fuse based) resistive memory elements.

Data storage device 8 also includes multiple read circuits 20, each of which is coupled to one or more associated sets of memory cells 12a, 12b by a respective bit line 16a, 16b. Each read circuit 20 includes a steering circuit 22 and a sense amplifier 24 and is operable to sense current flow through a memory cell of the associated group (or groups) of memory cells 12a, 12b. The steering circuit 22 selectively couples an associated sense amplifier 24 to a selected bit line 16a, 16b based upon a received bit line address ($A_Y$). Each steering circuit 22 also includes a set of switches that connects each bit line pair 16a, 16b to a voltage source of a constant voltage ($V_A$) or to an associated read circuit 20. A word line decode circuit 18 selectively activates a particular word line 14 based upon a received word line address ($A_X$). During read operations, word line decode circuit 18 may activate a selected word line 14 by connecting it to the ground and applying a constant voltage ($V_A$) to other unselected word lines. An output of each read circuit 20 is coupled to an input of a respective input/output (I/O) pad 28 of data storage device 8.

In the illustrated embodiment, a resistive cross point memory cell array is shown to have a relatively small number of memory cells 12a, 12b. Other embodiments, however, may include a large number of memory cells. For example, in one embodiment, resistive cross point memory cell array 10 includes a 1024×1024 array of memory cells 12a, 12b and two hundred and fifty-six read circuits 20, each read circuit 20 fitting a pitch of four bit lines 16a, 16b. In this embodiment, a total of four bit lines 16a, 16b may be multiplexed into each read circuit 20. Some embodiments may include multiple levels of memory cell arrays 12a, 12b. In these embodiments, bit lines 16a, 16b from different levels may be multiplexed into the read circuits 20.

In some embodiments, data storage device 8 also may include a write circuit (not shown) for writing information into the memory cells 12a, 12b of resistive cross point memory array 10.

As explained in detail below, the architecture of resistive cross point memory cell array 10 enables high-density fabrication and high-speed operation with isolation diodes that have practical dimensions and current density characteristics. In addition, data storage device 8 includes a novel equipotential isolation circuit that substantially avoids parasitic currents that otherwise might interfere with the sensing of the resistance state of the memory cells 12a, 12b.

Further reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

As shown in the drawings for purposes of illustration, the present invention is embodied in a magnetic random access memory device. The MRAM device includes an array of memory cells and a read circuit for reading data from the memory cells. The read circuit, which includes equipotential application devices and differential sensing amplifiers, can reliably sense different resistance states of selected memory cells within the array.

Reference is again made to FIG. 1, which illustrates an information storage device 8 including a resistive cross-point array 10 of memory cell elements 12a and 12b. The memory cell elements 12a and 12b are arranged in rows and columns, with the rows extending along an x-direction and the columns extending along a y-direction. Only a relatively small number of memory cell elements 12a and 12b is shown to simplify the illustration of the information storage device 8. In practice, arrays of any size may be used.

Traces functioning as word lines 14 extend along the x-direction in a plane on one side of the memory cell array 10. Traces functioning as bit lines 16a and 16b extend along the y-direction in a plane on an adjacent side of the memory cell array 10. There may be one word line 14 for each row of the array 10 and one bit line 16a or 16b for each column of the array 10. Each memory cell element 12a, 12b is located at a cross-point of a word line 14 and a bit line 16a or 16b.

The memory cell elements 12a and 12b may include thin film memory elements such as magnetic tunnel junctions (the SDT junction is a type of magnetic tunnel junction), or phase change devices. In general, the memory cells 12a and 12b may include any elements that store or generate information by affecting the magnitude of the nominal resistance of the elements. Such other types of elements include poly-silicon elements as part of read-only memory, and phase change device that could be programmed to change resistance state by changing the state of the material from crystalline to amorphous and vice versa.

Resistance of the SDT junction, for example, is a first value (R) if its magnetization orientation is parallel, and its resistance is increased to a second value (R+ΔR) if its magnetization orientation is changed from parallel to anti-parallel. A typical first resistance value (R) may be about 10 kΩ–1MΩ and a typical change in resistance (ΔR) may about 30% of the first resistance value (R).

Each memory cell element 12a and 12b retains its orientation of magnetization, even in the absence of external power. Therefore, the memory cell elements 12a and 12b are non-volatile.

Data is stored in the memory cell elements 12a and 12b in a bit-bit bar manner. Two memory cell elements 12a and 12b are assigned to each bit of data: one memory cell element (the "data" element) 12a stores the value of the bit, and the other memory cell element (the "reference" element) 12b stores the complement of the value. Thus, if a data element 12a stores a logic '1', its corresponding reference element 12b stores a logic '0'. Each column of data elements 12a is connected to a bit line 16a and each column of reference elements 12b is connected to a bit line 16b.

Figure 2A:
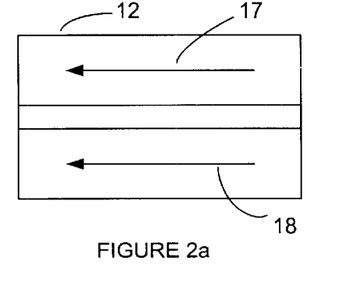
FIGS. 2a and 2b are illustrations of parallel and anti-parallel magnetization orientations of a magnetic tunnel junction memory cell.
Figure 2B:
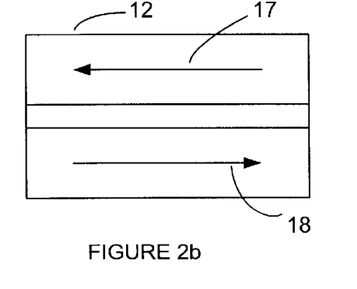

The memory cells 12a, 12b are not limited to any particular type of device. Referring to FIGS. 2A and 2B, spin dependent tunneling (SDT), such as MRAM, devices are well suitable for cross-point memories. A typical SDT MRAM cell 12 includes a "pinned" layer 17 and a "free" layer 18. The pinned layer 17 has a magnetization that is oriented in a plane, but remains fixed in the presence of an applied field in a range of interest. The free layer 18 has a magnetization that can be rotated by the applied field and its orientations are along the "easy-axis" and parallel with the pinned layer 17 magnetization. The magnetization orientation of the free layer 18 is either in parallel, shown in FIG. 2a, or anti-parallel, shown in FIG. 2b, to the magnetization of the pinned layer 17 corresponding to low resistance state and high resistance state respectively.

Returning to FIG. 1, the information storage device 8 includes a row decoder 18 for selecting word lines 14 during read and write operations. A selected word line 14 may be connected to ground during a read operation. A write current may be applied to a selected word line 14 during a write operation.

The information storage device 8 includes a read circuit for sensing the resistance states of selected memory cell elements 12a and 12b during read operations and a write circuit for supplying currents to selected word and bit lines 14, 16a and 16b during write operations. The read circuit is indicated generally at 20. The write circuit is not shown in order to simplify the illustration of the information storage device 8.

The read circuit 20 includes a plurality of steering circuits 22 and sense amplifiers 24. Multiple bit lines 16a, 16b are connected to each steering circuit 22. Each steering circuit 22 includes a decoder for selecting bit lines. A selected memory cell pair 12a, 12b lies at the intersection of a selected word line 14 and a selected bit line 16a, 16b.

Figure 5:
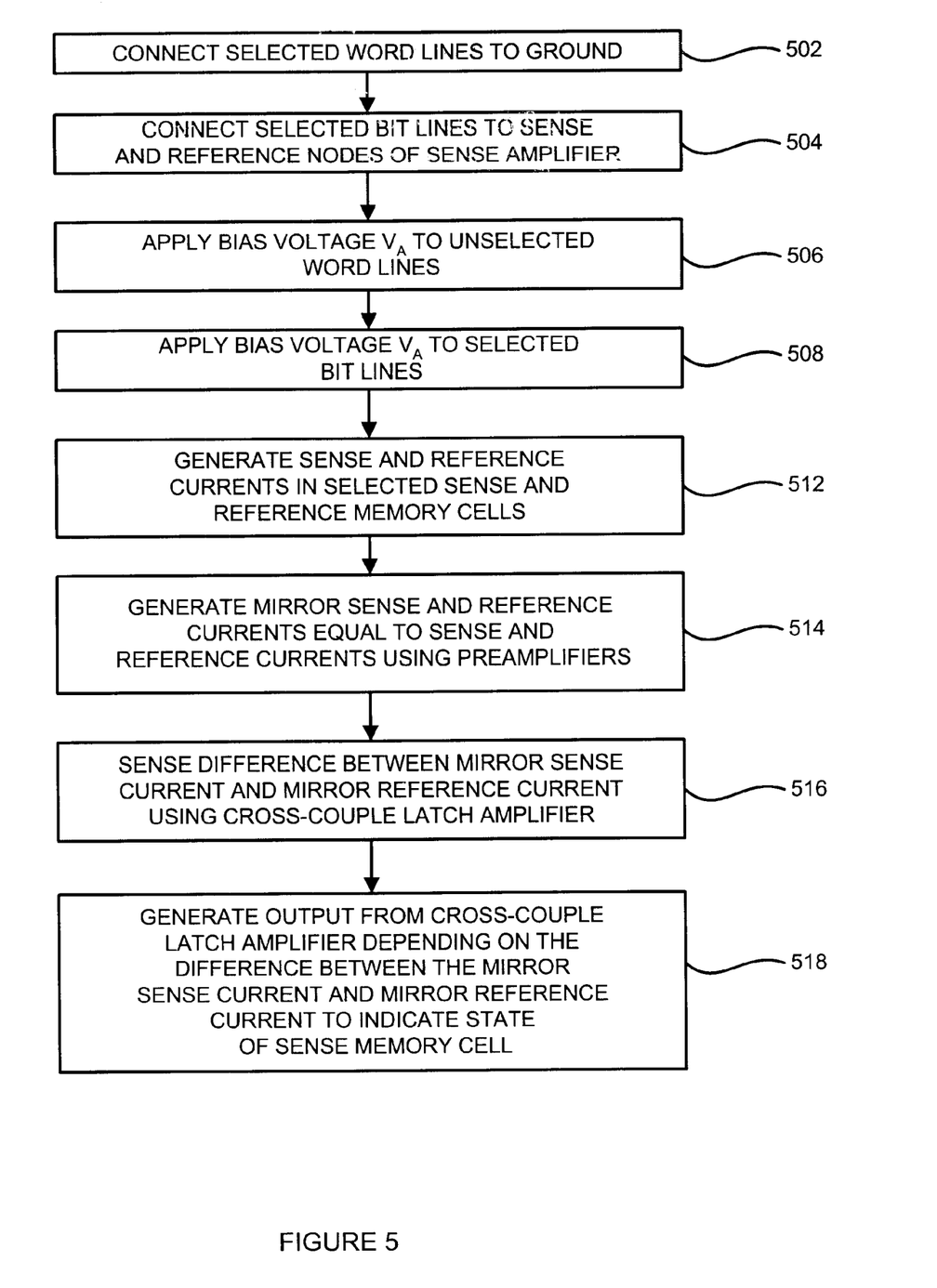
FIG. 5 depicts a flow diagram of the biasing scheme used during a sense operation in accordance with the present invention.

During a read operation, which is also depicted in the flow diagram of FIG. 5, the selected elements 12a and 12b are connected to ground by the selected word line 14a, as shown in block 502. Each steering circuit 22 selects a bit line 16a crossing a column of data elements 12a and a bit line 16b crossing the corresponding column of reference elements 12b. The selected bit lines 16a crossing the columns of data elements 12a are connected to sense nodes $S_0$ of their corresponding sense amplifiers 24, as shown in block 504. The steps of block 502 and 504 can be reversed and their order of implementation is not significant. The selected bit lines 16b crossing the columns of reference elements 12b are connected to reference nodes $R_0$ of their corresponding sense amplifiers 24. Each sense amplifier 24, shown in FIGS. 3a–3c, includes differential preamplifiers 36 and 38 and a cross-couple latched current sense amplifier 30 for comparing signals on the bit lines 16a and 16b. The comparison indicates the resistance state of the selected data element 12a and, therefore, the logic value stored in the selected data element 12a. An output of the sense amplifier 24 is supplied to a data register 26, which, in turn, is coupled to an I/O pad 28 of the information storage device 8.

All unselected word lines 14, are connected to a constant voltage source, which provides a bias voltage ($V_A$) as shown in block 506. An external circuit may provide the constant voltage source $V_A$. As indicated in block 508, the sense amplifiers 24 apply the same potential $V_A$ to the selected bit lines 16a, 16b, as the constant voltage source applies to the subset of unselected word-lines. Applying such equipotential isolation to the array 10 reduces parasitic currents.

The read circuit 20 may read out data in m-bit words, whereby the resistance states of a number (m) of memory cell elements 12a and 12b are sensed simultaneously, as described in blocks or steps 512–518 below. An m-bit word might be read out by operating m consecutive sense amplifiers 24 simultaneously.

Figure 3A:
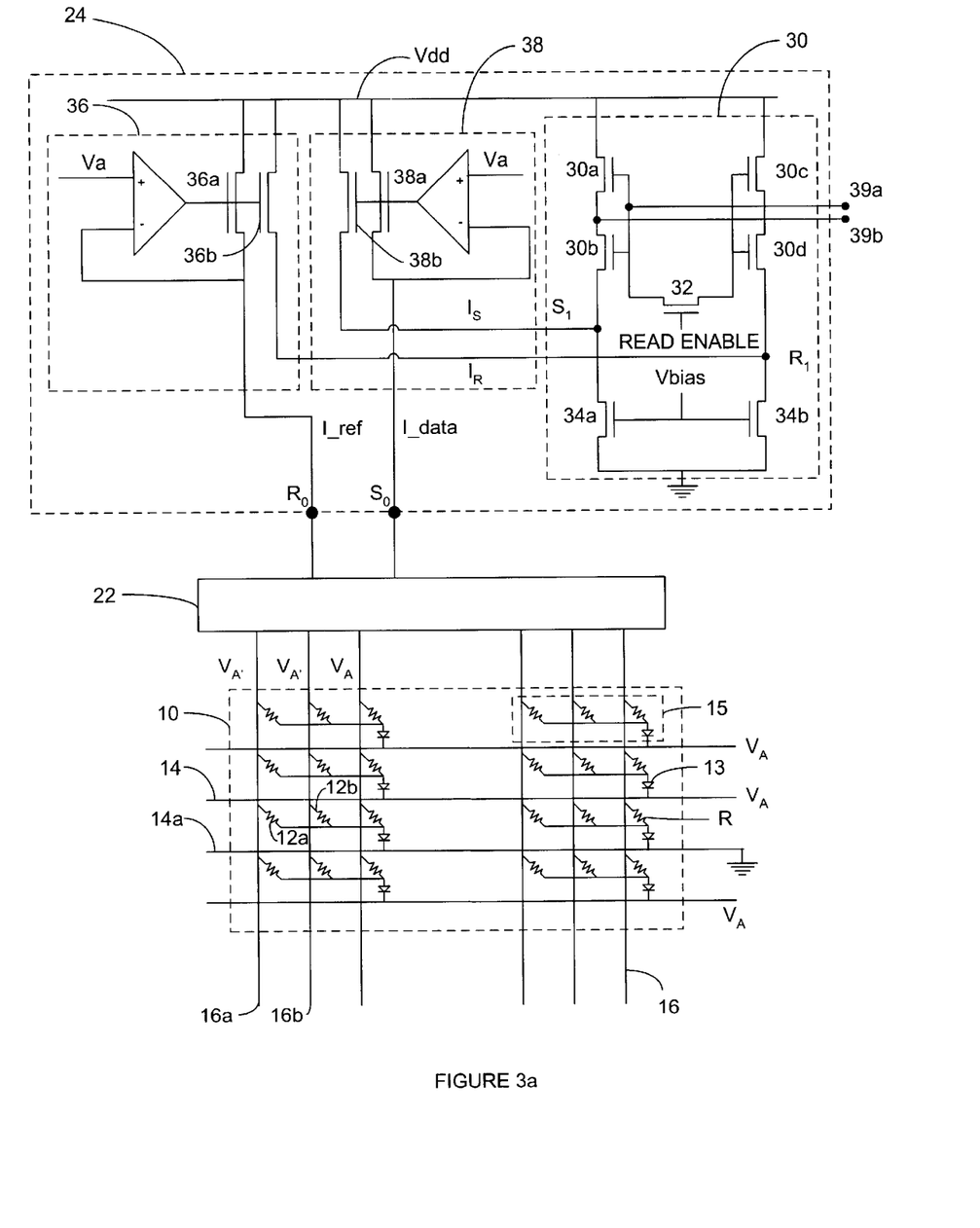
FIG. 3a is a circuit diagram of a portion of the resistive cross point memory cell array of FIG. 1, including multiple groups of three memory cells each connected between a respective word line and a common group isolation diode.

Referring to FIG. 3a, in one embodiment, the memory cells 12a, 12b of resistive cross point memory cell array 10 are arranged into multiple groups 15 of two or more memory cells 12a, 12b. For example, in the illustrated embodiment, each group 15 includes three memory cells 12a, 12b. The memory cells 12a, 12b of each group 15 are connected between respective bit lines 16a, 16b and a common group isolation diode 13, which is coupled to a word line 14. Resistive cross point memory cell array 10 features the high-speed operational advantages associated with diode isolation architectures and the high-density advantages of equipotential isolation architectures in an architecture that may be implemented with isolation diodes that have practical dimensions and current density characteristics. In some embodiments, isolation diodes 13 may be fabricated with memory cells 12a, 12b using a conventional thin film diode fabrication technology, thereby allowing multi-level resistive cross point memory arrays to be constructed.

For a read operation, data is sensed in a target cell of resistive cross point memory cell array 10 by selecting a word line 14 corresponding to the target memory cell, and connecting it to a ground potential. At the same time, bit lines 16a and 16b are connected to read circuits 20 in reference/sense pairs. An array potential ($V_A$) is applied to the unselected bit lines 16a, 16b of the selected group from the output of a voltage source. Also, the array potential ($V_A$) is applied to the inputs of the sense amplifier 24 that results in a coupling voltage ($V_{A'}$) on the selected bit lines 16a and 16b. The coupling voltage ($V_{A'}$) substantially equals to the array voltage ($V_A$). The bit lines of unselected groups are left floating. Under the above bias condition of the array, only bit cells of selected group 15 are forward biased with potential voltage $V_A$ and reference current I_ref and sense current I_data are flowing through memory cells 12a and 12b as a result. They are to be sensed by the amplifier 24 to determine the state of the bit cell. Also current is flowing in the bit cells of the selected group but does not interfere with the reference and sense currents.

Figure 3B:
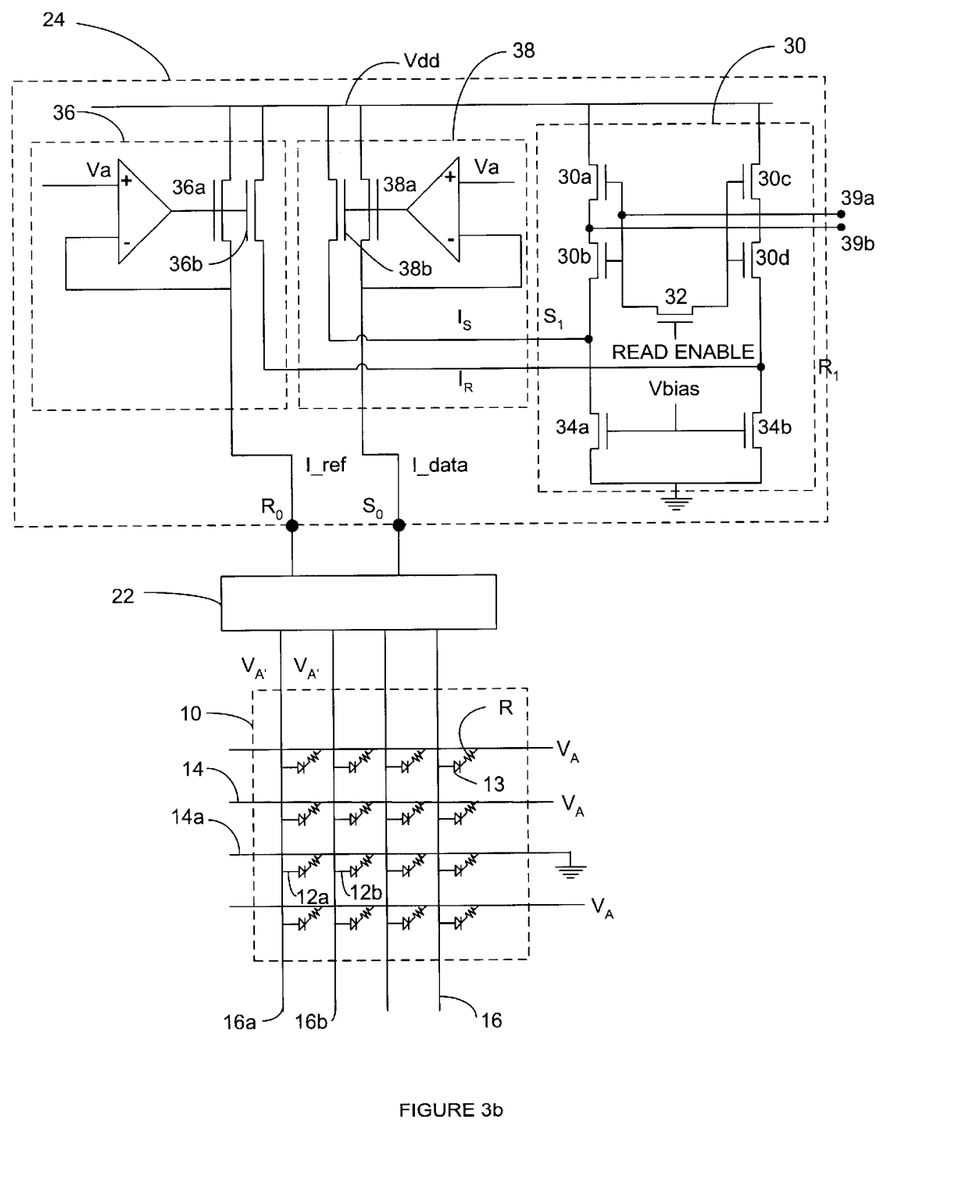
FIG. 3b is a circuit diagram of a sense amplifier circuit that is operable to sense current flow through a memory cell coupled to an isolation diode in accordance with the present invention.

FIG. 3b depicts an alternative embodiment where each memory cell 12a, 12b is coupled directly to a single isolation diode 13 as shown. The operation of array 10 through amplifier 24 is similar to that illustrated in FIG. 3a and described below.

A read operation is performed on the memory array 10 by connecting the selected word line 14 to the ground potential and connecting all unselected word lines to a potential ($V_A$) to minimize the effect of leakage currents on the sense and reference currents. The selected bit lines 16a and 16b are connected to the inputs of sense amplifier 24 through the multiplexer 22 and nodes $R_0$ and $S_0$. Other inputs of the sense amplifier are connected to the same potential ($V_A$) as the unselected word lines. Thus the selected bit lines 16a and 16b are biased to a potential ($V_{A'}$) that substantially equals to ($V_A$) while other unselected bit lines are left floating. Under the bias condition above to the array, only selected memory cells 12a and 12b are forward biased with potential voltage ($V_A$). As a result, the reference current I_ref and the sense current I_data flowing through memory cells 12a and 12b and sensed by the amplifier 24 are used to determine the state of the bit cell.

Figure 3C:
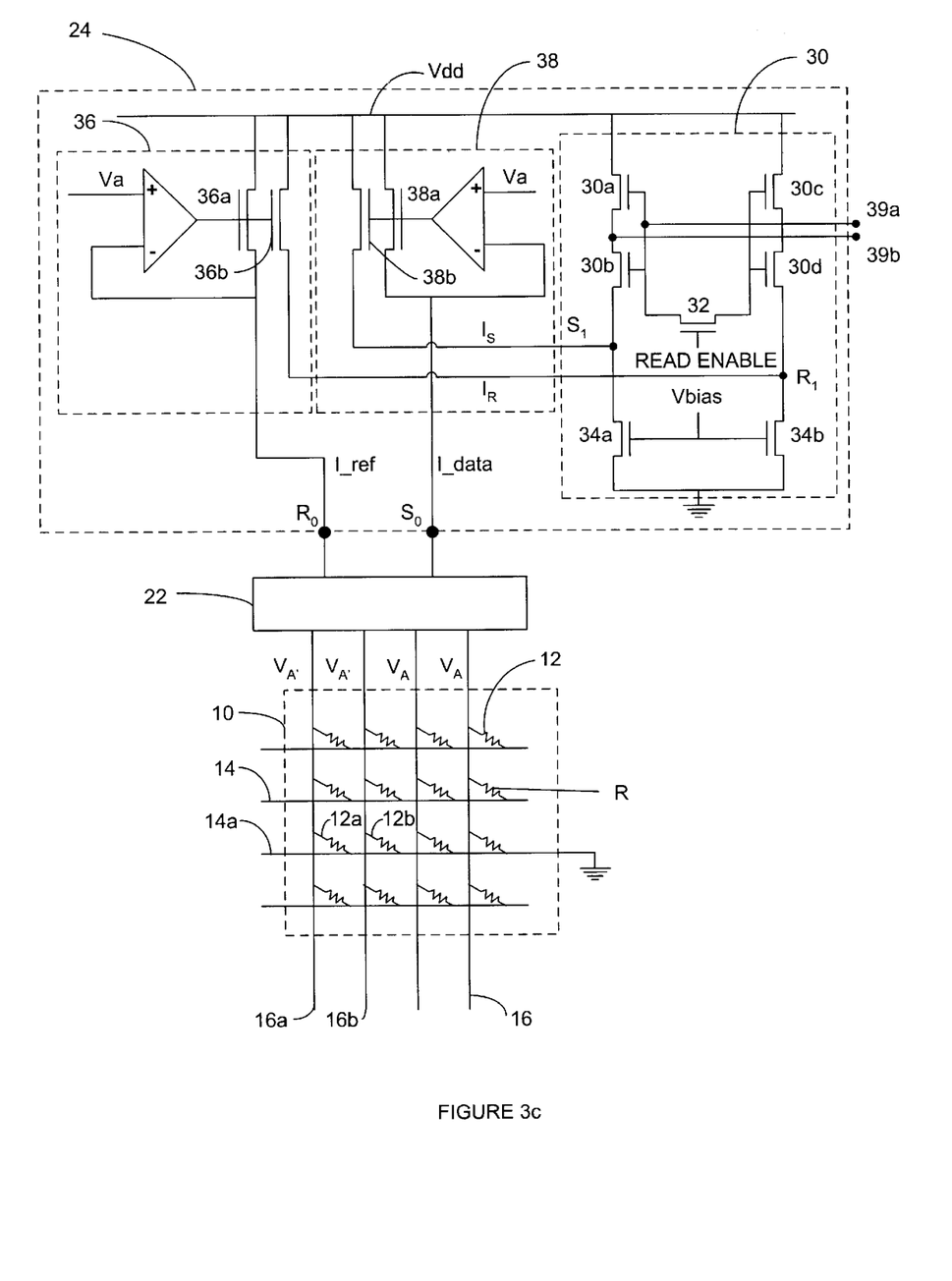
FIG. 3c is a circuit diagram of a sense amplifier circuit that is operable to sense current flow through a memory cell in accordance with the present invention.

Further, FIG. 3c depicts a memory cell 12a, 12b without any isolation diode. The operation of array 10 with amplifier 24 is identical to that of FIG. 3a, except for the lack of the isolation diode and the limitations normally imposed on the overall circuit. In the array 10, the magnetic tunnel junction cells 12a, 12b, are coupled through many parallel paths that interfere with sensing a bit in the array. This problem may be dealt with by using an "equipotential" method disclosed in U.S. Pat. No. 6,259,644 that involves applying a potential to the selected bit lines 16a and 16b and providing the same potential to a subset of unselected bit lines 16a, 16b and possibly to the unselected word lines 14. The selected word line 14a is connected to the ground potential. Therefore, only memory cells 12a, 12b connected to the selected word line 14a have voltage ($V_A$) across them. Thus, currents are flowing through the cells 12a, 12b on selected word line 14a in a manner so that said currents do not interfere with one another. The reference current I_ref and the sense current I_data can be accurately sensed by the sense amplifier 24, which determines the state of the stored data bit.

The sense amplifier 24 is common to all three FIGS. 3a, 3b and 3c and its operation is substantially identical in each application. The sense amplifier 24 includes cross-couple amplifier 30 having a first input node $S_1$ and a second input node $R_1$. The amplifier 30 may include FETs 30a, 30b, 30c, and 30d, connected in a cross-couple configuration. In one embodiment, transistors 30a and 30c are P-channel transistors, and transistors 30b and 30d are N-channel transistors. A read enable transistor 32 enables the FETs 30a, 30b, 30c, 30d during a read operation, which in turn enables outputs OUTPUT and OUTPUT bar at terminals 39a and 39b, which are complementary states. Transistors 34a and 34b are biased to clamp the nodes $S_1$ and $R_1$ close to a ground potential. Once transistor 32 turns off, the cross couple latch compares the current $I_S$ with the current $I_R$ enabling the outputs OUTPUT and OUTPUT-bar to go to a corresponding state, which is illustrated in the READ timing diagram of the sense amplifier shown in FIG. 5.

Cell 12b serves as a reference bit and cell 12a is the data bit and both are located on the same word line 14. A ground potential is applied to the selected word line 14a. Preamplifier 36 has a first input that connects to voltage source ($V_A$) and its output is coupled to the gate input of transistor 36a. The source terminal of transistor 36a and the second input of preamplifier 36 are coupled to the selected bit line 16a to which cell 12a is connected. Similarly, the first input of preamplifier 38 is connected to the voltage source $V_A$ and its output is connected to the gate input of transistor 38a. The source terminal of transistor 38a and the second input of preamplifier 38 are coupled to the selected bit line 16b to which cell 12b is connected. The preamplifiers 36 and 38 regulate the voltage on bit lines 16a and 16b to a potential ($V_{A'}$) that substantially equals to voltage ($V_A$). The selected memory elements 12a and 12b thus have a potential ($V_A$) across each of them.

Step 512 in measuring the current in a selected memory cell is to generate currents in the sense and reference cells 12a and 12b. Specifically, a current I_ref=($V_A$−$V_d$)/R12a flows in selected element 12a and a current I_data=($V_A$−$V_d$)/R12b flows in the selected element 12b as a result of the applied voltages described above. In this embodiment, R12a and R12b are the resistive values of the memory cells 12a, 12b and $V_d$ is the forward diode voltage of diode 13, which is typically approximately 0.7 V. These currents are also flowing through transistors 36a and 38a. At step 514, a mirror transistor 36b, which is identical to transistor 36a, is a current mirror to 36a and generates a current $I_R$ to an input of cross-couple amplifier 30. Current $I_R$ is equal to I_ref. Similarly, a mirror transistor 38b, which is identical to transistor 38a, is a current mirror to 38a and generates a current $I_S$ to another input of cross-couple amplifier 30. Current $I_S$ is equal to I_data.

Figure 4:
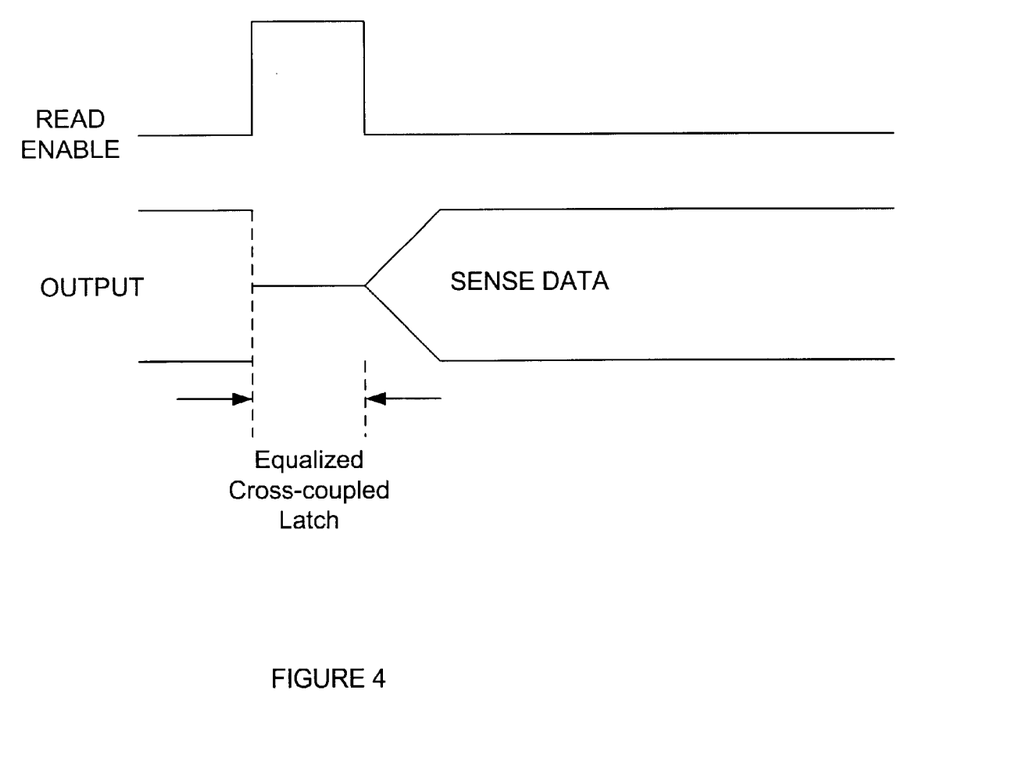
FIG. 4 illustrates a timing diagram of the sensing and output of a data cell and reference cell as performed on the sensing amplifier of FIG. 3.

Initially, transistor 32 is turned on when Read Enable is pulled high as shown in FIG. 4. This forces the outputs OUTPUT and OUTPUT-bar to be similar to about the mid-point between Vdd and ground.

At step 516, once read enable switch 32 is switched off, the cross-couple latch amplifier 30 senses the difference in magnitude of currents $I_S$ and $I_R$. Then, at step 518, cross-couple amplifier 30 generates an output signal indicating the state of the selected memory cell 12a. Specifically, when $I_S$ is less than $I_R$, the output signal OUTPUT is high, which means R12b is in a parallel state and R12a is in an anti-parallel state. When $I_S$ is greater than $I_R$, the output signal OUTPUT is low, which means R12b is in an anti-parallel state and R12a is in a parallel state.

The preamplifiers 36 and 38 are preferably calibrated to minimize differences in their offset voltages (ofst1, ofst2). The offset voltages (ofst1, ofst2) should be very close to being equal to each other and they should be near zero. The transistor pair 36a,b and transistor pair 38a,b are preferably matched in properties and size so they are less likely to degrade the sense signals $I_S$ and $I_R$.

The sensing may be performed in current mode or voltage mode. In current mode, the preamplifiers 36 and 38 regulate the voltages at the sense and reference nodes $S_0$ and $R_0$ to be equal to the array voltage $V_A$. The sense and reference currents ($I_S$ and $I_R$), which are created by the voltage drop across the selected elements 12a and 12b, flow to the input nodes $S_1$, $R_1$ of the differential current sense amplifier 30.

In voltage mode, the sense current $I_S$ and reference current $I_R$ are each converted to a voltage (e.g., by integrating the sense current over a period of time) or the sense and reference currents $I_S$ and $I_R$ may be terminated with a pair of resistors. When $I_S$ is less than $I_R$, the potential at node $S_1$ is lower than the potential at node $R_1$.

Once a reliable signal on the output terminals 39a and 39b of the cross-couple amplifier 30 has developed, the output of the amplifier 30 is strobed into the data register 26 shown in FIG. 1. An on-chip controller 29 (see FIG. 1) may be provided to generate a signal STR for causing the output signals OUTPUT and OUTPUT bar of the amplifier 30 to be strobed into the data register 26. The strobe signal STR could be as simple as a delayed pulse generated by the last address or write/read command.

If the output signal OUTPUT at output node 39a is high, then that means that the resistive data value is low while if the output at output node is low, then this represents that the resistive data value is high. The use of a cross-couple latch amplifier 30 provides advantages over the prior art. One advantage is that the differential sensing with cross-couple latch amplification causes common mode noise distortion to be rejected. This results in a cleaner and more readily discernible output signal. Further, the amplifier 30 provides better performance than a prior art amplifier since current sensing is not susceptible to stray capacitance and requires a simple control signal READ ENABLE to sample the data signal. Furthermore, non-destructive read by using a reference MTJ within the same group is provided as opposed to a destructive read required in prior art designs. Destructive read operations can degrade the signal quality over multiple reads. Further still, the differential sense amplifier in accordance with the present invention offers a simple design over differential sense amplifiers of the prior art. Performance variations that occur in the select diode/transistor do not affect the sensing of the signal as opposed to prior art solutions. This simplifies manufacturing costs and reduces surface area typically associated with prior systems.

Although the above embodiments are representative of the present invention, other embodiments will be apparent to those skilled in the art from a consideration of this specification and the appended claims, or from a practice of the embodiments of the disclosed invention. It is intended that the specification and embodiments therein be considered as exemplary only, with the present invention being defined by the claims and their equivalents.

What is claimed is:

1. An information storage device, comprising:
   a resistive cross point memory cell array;
   a plurality of word lines;
   a plurality of bit lines, wherein the memory cells are arranged into multiple groups of two or more memory cells, each of the memory cells of each group being connected between a respective bit line and a common isolation diode coupled to a common word line; and
   a differential sensing amplifier, coupled to the memory cell array, comprising:
   first and second input nodes;
   a first preamplifier coupled to the first input node;
   a second preamplifier coupled to the second input node; and
   a cross-couple latch amplifier, coupled to an output from the first preamplifier and an output from the second preamplifier, operable to determine a resistive state of a memory cell within the array.

2. The invention according to claim 1 wherein the differential sensing amplifier further comprises a current mirror, coupled to the first and second preamplifiers.

3. The invention according to claim 1 wherein the cross-couple latch amplifier is operable to compare current flowing through a selected memory cell with current flowing through one or more reference cells.

4. The invention according to claim 1 further comprising multiple read circuits each coupled to one or more associated groups of memory cells by a respective bit line and operable to sense current flow through a memory cell of the associated groups.

5. The invention according to claim 1 further comprising multiple comparator circuits each coupled to an associated read circuit and operable to convert an analog differential sense voltage to a digital output read signal.

6. The invention according to claim 1 further comprising a voltage source connected to the unselected word lines and the bit lines and operable to set voltage levels in the restive cross point memory cell array to substantially prevent parasitic currents from flowing through unselected memory cells.

7. The invention according to claim 6 further comprising a second voltage source coupled to the selected bit lines via a preamplifier and operable to set a voltage level across the selected resistive cross point memory cells in an array to generate reference and data currents for sensing the state of the selected bit cells.

8. The invention according to claim 1 wherein each memory cell comprises a magnetic random access memory element.

9. A differential sensing amplifier to sense a resistive state of a selected bit cell within a memory cell array, comprising:
   a first input node coupled to the selected bit cell;
   a second input node coupled to a reference cell within the memory cell array;
   a first preamplifier coupled to the first input node for sensing the current in the selected bit cell and generating a mirror sense current;
   a second preamplifier coupled to the second input node for sensing the current in the reference cell and generating a mirror reference current; and
   a cross-couple latch amplifier, coupled to an output from the first preamplifier and an output from the second preamplifier, and being operable to sense the difference between the mirror sense current and the mirror reference current to determine a resistive state of the selected bit cell as compared to the reference cell within the memory cell array.

10. The invention according to claim 9 wherein the differential sensing amplifier further comprises a current mirror, coupled to the first and second preamplifiers.

11. The invention according to claim 9 wherein the cross-couple latch amplifier is operable to compare current flowing through a selected memory cell with current flowing through one or more reference cells.

12. The invention according to claim 9 further comprising multiple read circuits each coupled to one or more associated groups of memory cells by a respective bit line and operable to sense current flow through a memory cell of the associated groups.

13. The invention according to claim 9 further comprising multiple comparator circuits each coupled to an associated read circuit and operable to convert an analog differential sense voltage to a digital output read signal.

14. The invention according to claim 9 wherein each memory cell comprises a magnetic random access memory element.

15. An information storage device, having a memory cell array with a plurality of sense cells and reference cells, each sense cell and reference cell having multiple states, a plurality of word lines, a plurality of bit lines and a differential sense amplifier, coupled to the memory cell array, the differential sense amplifier comprising:
   (a) first and second input nodes, the first input node being selectively coupled to a sense bit line connected to a selected sense cell within the array, and the second input node being selectively coupled to a reference bit line connected to a selected reference cell within the array;
   (b) a first preamplifier coupled to the first input node and having an output providing a first current representative of a state of the selected sense cell;
   (c) a second preamplifier coupled to the second input node and having an output providing a second current representative of a state of the selected reference cell; and (d) a cross-couple amplifier, coupled to the output of the first preamplifier and the output of the second preamplifier, and being operable to sense the first and second currents to determine the state of the selected sense cell.

16. The information storage device according to claim 15 wherein the first preamplifier includes a mirror circuit for generating a first mirror current substantially identical to a current flowing through the selected sense cell and the second preamplifier includes a second mirror circuit for generating a second mirror current substantially identical to a current flowing through the selected reference cell.

17. The information storage device according to claim 16, wherein the cross-couple amplifier is operable for sensing the difference between the first and second mirror currents to determine the state of the selected sense cell.

18. The information storage device according to claim 17, wherein the difference circuit comprises a first sense circuit in communication with the first mirror current and a second sense circuit in communication with the second mirror current.

19. The information storage device according to claim 18, wherein the first sense circuit provides a first output in response to the first mirror current, and the second sense circuit provides a second output complementary to the first output in response to the second mirror current.

20. A method for determining a state of a selected sense cell in an information storage device having a memory cell array with a plurality of sense cells and reference cells, each sense cell and reference cell having multiple states, a plurality of word lines, a plurality of bit lines and a sense amplifier coupled to the memory cell array, comprising:

(a) selectively coupling a sense bit line connected to a selected sense cell within the array to a first input node on the sense amplifier;

(b) selectively coupling a reference bit line connected to a selected reference cell within the array to a second input node on the sense amplifier;

(c) generating a first current representative of a state of the selected sense cell using a first preamplifier coupled to the first input node;

(d) generating a second current representative of a state of the selected reference cell using a second preamplifier coupled to the second input node; and (e) sensing the difference between the first current and the second current to determine the state of the selected sense cell.

21. The method according to claim 20 wherein the sensing step comprises determining the difference between the first current and the second current using a cross-couple amplifier.

22. A method for determining a state of a selected sense cell in an information storage device having a memory cell array with a plurality of sense cells and reference cells, each sense cell and reference cell having multiple states, a plurality of word lines, a plurality of bit lines and a sense amplifier coupled to the memory cell array, comprising:

(a) generating a sense current in a selected memory cell having a state to be determined;

(b) generating a reference current in a selected reference cell associated with the selected memory cell;

(c) generating a mirror sense current substantially equal to the sense current;

(d) a mirror reference current substantially equal to the reference current; and (e) determining the state of the selected memory cell based upon a comparison of the mirror sense current and mirror reference current.

23. The method according to claim 22, further comprising the step of generating a first sense current by connecting the mirror sense current to a first sense circuit and generating a second sense current by connecting the mirror reference current to a second sense circuit.

24. The method according to claim 23, wherein output signal is generated by providing a first output in response to the first sense current, and providing a second output complementary to the first output in response to the second sense current.

* * * * *